United States Patent
Kumamoto

(10) Patent No.: US 9,583,376 B2
(45) Date of Patent: Feb. 28, 2017

(54) SUCTION-HOLDING APPARATUS AND WAFER POLISHING APPARATUS

(71) Applicant: ROHM CO., LTD., Kyoto-shi, Kyoto (JP)

(72) Inventor: Nobuhisa Kumamoto, Kyoto (JP)

(73) Assignee: ROHM CO., LTD., Kyoto (JP)

( * ) Notice: Subject to any disclaimer, the term of this patent is extended or adjusted under 35 U.S.C. 154(b) by 200 days.

(21) Appl. No.: 14/231,992

(22) Filed: Apr. 1, 2014

(65) Prior Publication Data

US 2014/0302755 A1    Oct. 9, 2014

(30) Foreign Application Priority Data

Apr. 5, 2013    (JP) ................. 2013-079337

(51) Int. Cl.
*B24B 37/30* (2012.01)
*H01L 21/683* (2006.01)
*B25B 11/00* (2006.01)

(52) U.S. Cl.
CPC .......... *H01L 21/6838* (2013.01); *B24B 37/30* (2013.01); *B25B 11/005* (2013.01)

(58) Field of Classification Search
CPC .... B25B 11/005; B24B 37/30; H01L 21/6838
USPC .................... 451/289, 388; 269/21
See application file for complete search history.

(56) References Cited

U.S. PATENT DOCUMENTS

| | | | | |
|---|---|---|---|---|
| 4,138,304 A * | 2/1979 | Gantley | ................. | B28D 1/003 125/13.01 |
| 4,675,242 A * | 6/1987 | Hashimoto | ........... | B25B 11/005 269/21 |
| 5,809,987 A * | 9/1998 | Wark | ................... | B28D 5/0094 125/12 |
| 6,024,631 A * | 2/2000 | Piper | ....................... | B24B 37/30 125/12 |
| 6,165,232 A * | 12/2000 | Tieber | ............... | H01L 21/67092 257/E21.599 |
| 6,325,059 B1 * | 12/2001 | Tieber | .................. | B28D 5/0094 125/35 |
| 6,419,570 B1 * | 7/2002 | Werner | .................. | B24B 9/146 451/384 |
| 6,484,393 B1 * | 11/2002 | Chan | ..................... | B25B 11/005 174/260 |
| 6,837,776 B2 * | 1/2005 | Shimobeppu | ........... | B24B 37/30 451/287 |

(Continued)

FOREIGN PATENT DOCUMENTS

JP    02053558 A * 2/1990
JP    2000-158268    6/2000

*Primary Examiner* — Eileen Morgan
(74) *Attorney, Agent, or Firm* — Hamre, Schumann, Mueller & Larson, P.C.

(57) ABSTRACT

A suction-holding apparatus includes a suction plate made of an air-permeable material, a holding member formed with a through-hole in which the suction plate is placed, and a base to which the holding member is attached. The suction plate includes a jutting-out portion so that the outer edge of the rear face is disposed outwardly from the outer edge of the front face. The through-hole includes a first edge and a second edge spaced apart from each other in the thickness direction. The first edge is adjacent to the base. The holding member includes an eaved portion so that the second edge of the through-hole is disposed inwardly from the outer edge of the rear face.

20 Claims, 11 Drawing Sheets

(56) References Cited

U.S. PATENT DOCUMENTS

| | | | | |
|---|---|---|---|---|
| 6,840,845 B2* | 1/2005 | Numoto | ................... | B24B 37/30 |
| | | | | 451/285 |
| 7,438,286 B2* | 10/2008 | Umahashi | ............. | B25B 11/005 |
| | | | | 269/21 |
| 7,654,887 B2* | 2/2010 | Ishikawa | ................. | B24B 37/30 |
| | | | | 451/388 |
| 2002/0160693 A1* | 10/2002 | Nihonmatsu | ........... | B24B 37/30 |
| | | | | 451/41 |
| 2003/0068965 A1* | 4/2003 | Yi | ........................... | B24B 37/04 |
| | | | | 451/259 |
| 2003/0181150 A1* | 9/2003 | Arai | ........................ | B24B 7/228 |
| | | | | 451/285 |
| 2005/0118933 A1* | 6/2005 | Sakai | .................... | B24B 37/042 |
| | | | | 451/41 |
| 2006/0040586 A1* | 2/2006 | Arai | ...................... | B24B 37/042 |
| | | | | 451/5 |
| 2007/0026772 A1* | 2/2007 | Dolechek | ................ | B24B 7/228 |
| | | | | 451/388 |
| 2009/0305617 A1* | 12/2009 | Nakamura | .......... | H01L 21/6875 |
| | | | | 451/364 |
| 2009/0325467 A1* | 12/2009 | Nakamura | ............. | B24B 7/228 |
| | | | | 451/28 |
| 2010/0022166 A1* | 1/2010 | Kimba | .................... | B24B 9/065 |
| | | | | 451/5 |
| 2010/0291839 A1* | 11/2010 | Luo | ...................... | B24B 41/068 |
| | | | | 451/44 |

* cited by examiner

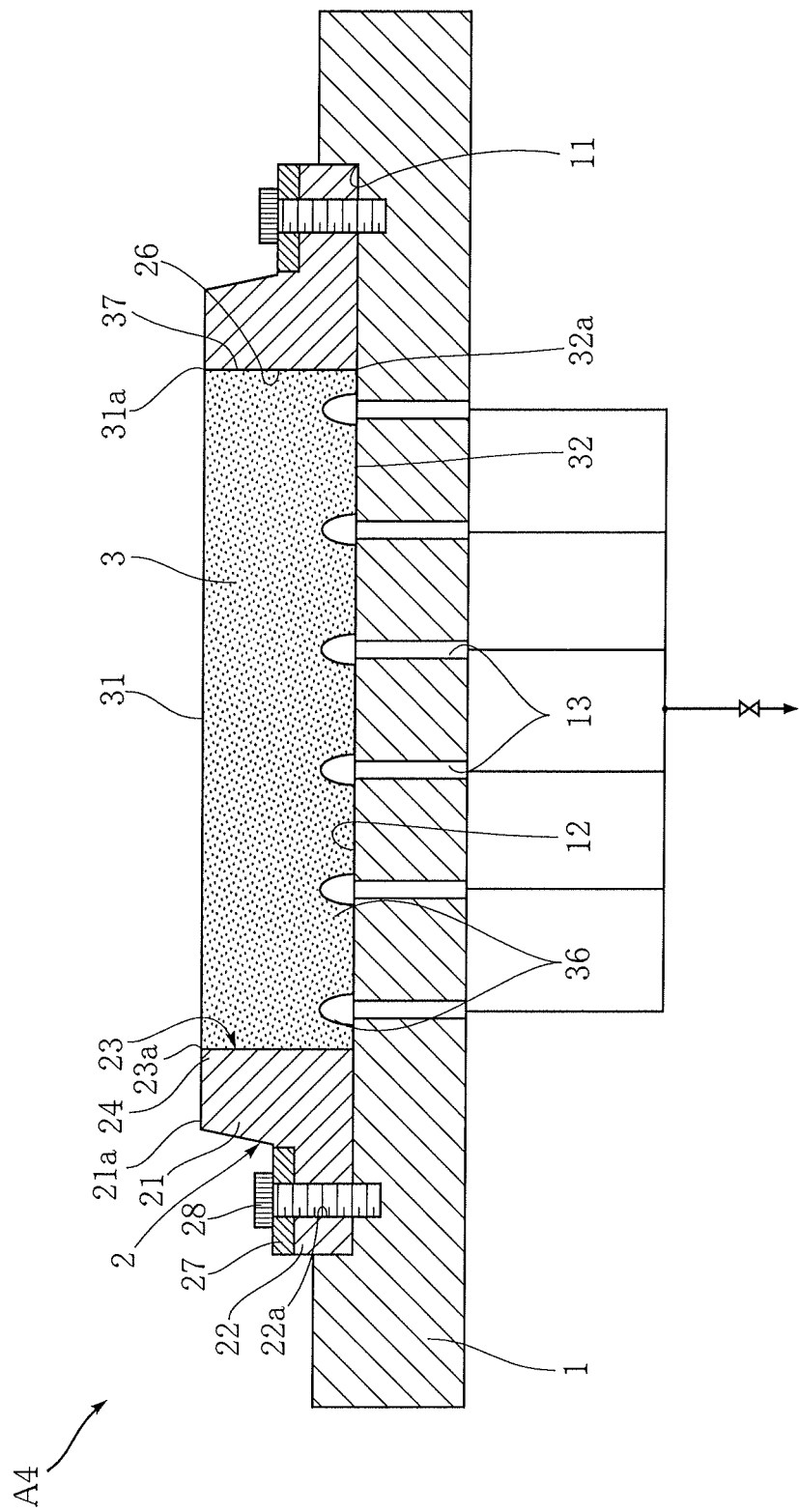

SUCTION-HOLDING APPARATUS AND WAFER POLISHING APPARATUS

BACKGROUND OF THE INVENTION

1. Field of the Invention:

The present invention relates to a suction-holding apparatus and a wafer polishing apparatus.

2. Description of the Related Art:

Wafer polishing apparatuses for polishing semiconductor wafers employ e.g., a polishing device having a polishing pad. By the polishing process, it is expected that the semiconductor wafer is to have a predetermined thickness, and also have a smooth surface. To this end, it is essential to hold the semiconductor wafer securely in a flat state. An example of suction-holding apparatuses for holding a semiconductor wafer is disclosed in JP-A-No. 2000-158268.

The suction-holding apparatus of JP-A-No. 2000-158268 includes a base and a suction plate. The base includes a circular cavity, and a plurality of suction holes formed in the bottom face of the cavity. The suction holes are connected to a suction device such as a pump, so as to suck an object.

The suction plate is fitted in the cavity of the base. The suction plate is composed of a plurality of annular elements that are concentrically disposed. The annular elements include high-permeability annular elements constituted of an air-permeable material such as a porous ceramic, and low-permeability annular elements that are barely air-permeable. The high-permeability annular elements and the low-permeability annular elements are alternately located. The low-permeability annular elements are significantly smaller in radial size than the high-permeability annular elements, and serve as blocking walls that restrict permeation of air.

When the wafer polishing apparatus is used for polishing, the semiconductor wafer to be polished is mounted on the suction plate by using the suction-holding apparatus. Then the semiconductor wafer is sucked through the suction holes. At this point, a suction force is exerted on the semiconductor wafer through the high-permeability annular elements of the suction plate. The suction force allows the semiconductor wafer to be held by the suction-holding apparatus, thus to be ready to be polished. In the suction-holding apparatus, the suction holes are divided into some groups, each of which is connected to the suction device. Controlling the suction performance of each group, for example by using valves, allows only selected high-permeability annular elements to activate the suction force according to the size of the semiconductor wafer to be polished, from those having a relatively small diameter to those having a relatively large diameter.

The suction plate, including a portion made of e.g. a porous ceramic, is fixed to the base, using an adhesive, for example. Specifically, the suction plate is bonded to the bottom face of the cavity of the base. However, the suction plate is repeatedly subjected to compressive force and shear force from the polishing device, via the semiconductor wafer. Accordingly, the bonding force of the adhesive declines through repeated polishing sessions, and one or more of the plurality of annular elements of the suction plate may be separated from the base. In such a case, a minute step is formed on the surface of the suction plate, thereby preventing the semiconductor wafer from being securely held.

SUMMARY OF THE INVENTION

The present invention has been proposed under the above-noted circumstances. It is therefore an object of the present invention to provide a suction-holding apparatus in which the suction plate can be securely fixed to the base. Another object of the present invention is to provide a wafer polishing apparatus incorporating such a suction-holding apparatus.

According to a first aspect of the present invention, there is provided a suction-holding apparatus including: a suction plate made of an air-permeable material and including a front face and a rear face that are spaced apart from each other in a thickness direction of the suction plate; a holding member formed with a through-hole in which the suction plate is placed; and a base to which the holding member is attached, and the base is adjacent to the rear face of the suction plate. The suction plate is formed with at least one jutting-out portion in a manner such that the outer edge of the rear face is disposed outwardly from the outer edge of the front face as viewed in the thickness direction at the jutting-out portion. The through-hole includes a first edge and a second edge that are spaced apart from each other in the thickness direction, and the first edge is adjacent to the base. The holding member is formed with at least one eaved portion in a manner such that the second edge of the through-hole is disposed inwardly from the outer edge of the rear face as viewed in the thickness direction at the jutting-out portion.

Preferably, at least a part of the suction plate is made of a porous ceramic.

Preferably, the holding member is made of a non-air-permeable ceramic.

Preferably, the holding member includes a surface flush with the front face of the suction plate.

Preferably, the jutting-out portion of the suction plate includes a sloped surface extending between the outer edge of the front face and the outer edge of the rear face.

Preferably, the jutting-out portion of the suction plate includes a stepped portion disposed between the outer edge of the front face and the outer edge of the rear face.

Preferably, the jutting-out portion of the suction plate is formed along an entire circumference of the suction plate, and the eaved portion of the holding member is formed along an entire circumference of the holding member.

Preferably, the suction plate includes an additional jutting-out portion spaced apart from the above-noted at least one jutting-out portion, and the holding member includes an additional eaved portion spaced apart from the above-noted at least one eaved portion.

Preferably, the suction plate includes an upright side face that is located between the above-noted at least one jutting-out portion and the additional jutting-out portion and erected in the thickness direction, and the holding member includes an upright side face that is located between the above-noted at least one eaved portion and the additional eaved portion and erected in the thickness direction.

Preferably, the suction plate is made up of a plurality of annular elements that are concentrically disposed, and each of the annular elements includes a front face and a rear face that are spaced apart from each other in the thickness direction. Each annular element is formed with a jutting-out portion and an eaved portion. The outer edge of the rear face of each annular element is disposed outwardly from the outer edge of the front face of each annular element as viewed in the thickness direction at the jutting-out portion of each annular element. The inner edge of the front face of each annular element is disposed inwardly from the inner edge of the rear face of each annular element as viewed in the thickness direction at the eaved portion of each annular element.

Preferably, the annular elements include high-permeability annular elements and low-permeability annular elements having a lower air permeability than the high-permeability annular elements. The high-permeability annular elements and the low-permeability annular elements are alternately located.

Preferably, the base is made of a metal.

Preferably, the suction-holding apparatus of the first aspect further includes a bolt for fixing the holding member to the base.

Preferably, the holding member includes an annular portion in which the through-hole is formed, and a flange portion outwardly extending from the annular portion.

Preferably, the flange portion is formed with a fixing hole through which the bolt is passed.

Preferably, the annular portion includes a portion offset from the bolt toward the front face of the suction plate in the thickness direction.

Preferably, the base includes a bottom face opposed to the rear face of the suction plate, where the bottom face is formed with at least one suction hole.

Preferably, the suction plate include a recess formed in the rear face and located so as to overlap the above-noted at least one suction hole as viewed in the thickness direction.

Preferably, the base includes a bottom face opposed to the rear face of the suction plate, and the bottom face is formed with a plurality of the suction holes arranged in a circle. The suction plate includes an annular groove formed in the rear face and located so as to overlap the suction holes as viewed in the thickness direction.

According to a second aspect, of the present invention, there is provided a wafer polishing apparatus including: a suction-holding apparatus of the first aspect; and a polishing device for polishing a semiconductor wafer held by the suction-holding apparatus.

Other features and advantages of the present invention will become more apparent through detailed description given below with reference to the accompanying drawings.

BRIEF DESCRIPTION OF THE DRAWINGS

FIG. 11 is a cross-sectional view taken along the line XI-XI in FIG. 10.

DETAILED DESCRIPTION OF PREFERRED EMBODIMENTS

Preferred embodiments of the present invention will be described below with reference to the drawings.

Figure 1:
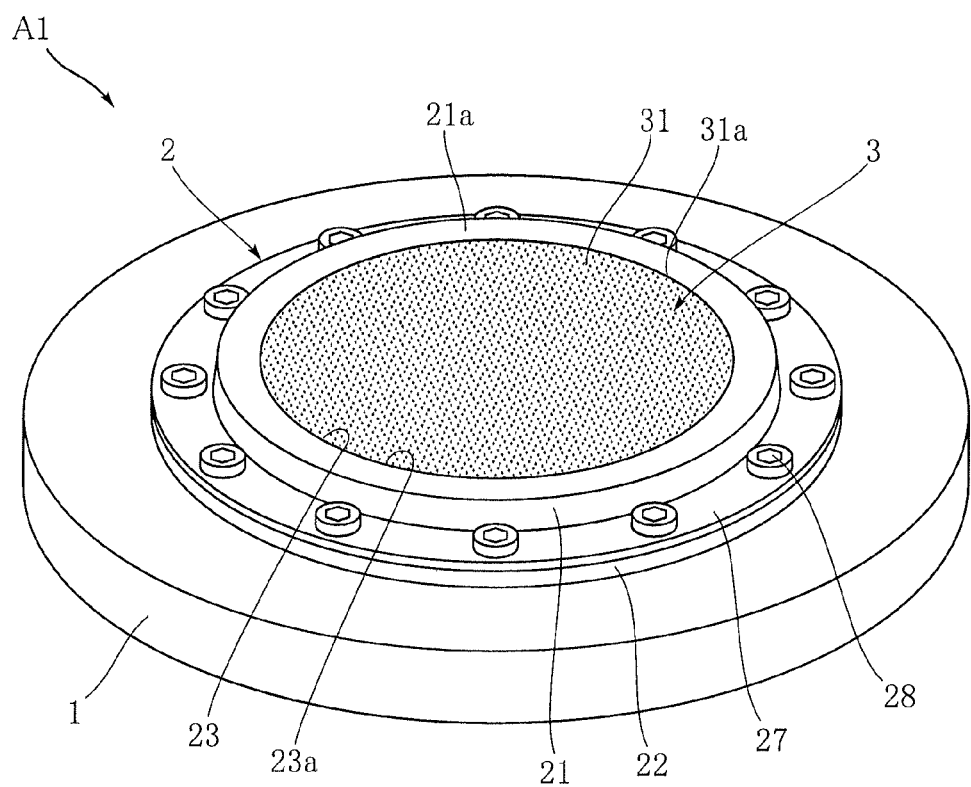
FIG. 1 is a perspective view showing a suction-holding apparatus according to a first embodiment of the present invention.
Figure 2:
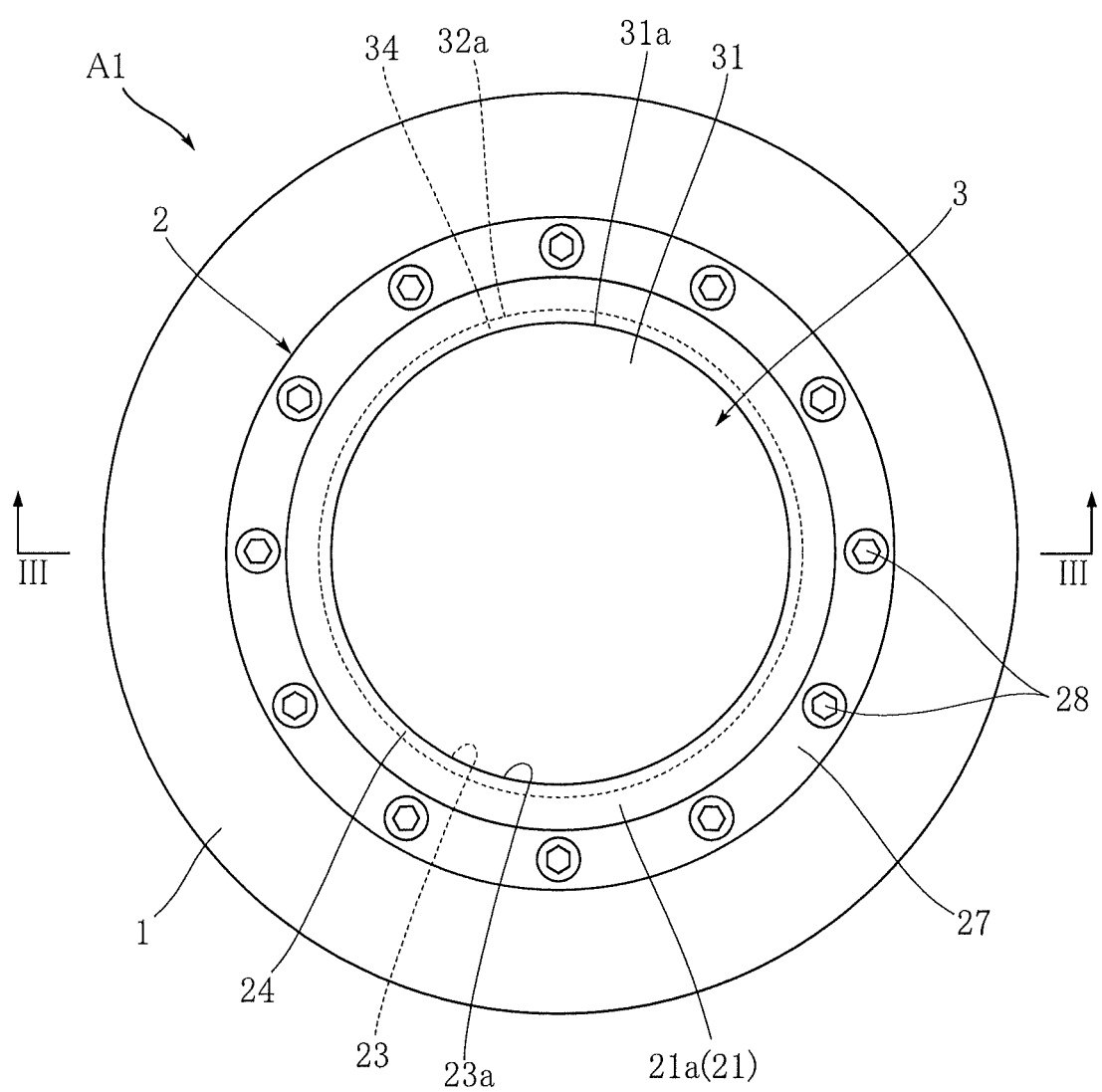
FIG. 2 is a plan view of the suction-holding apparatus shown in FIG. 1.
Figure 3:
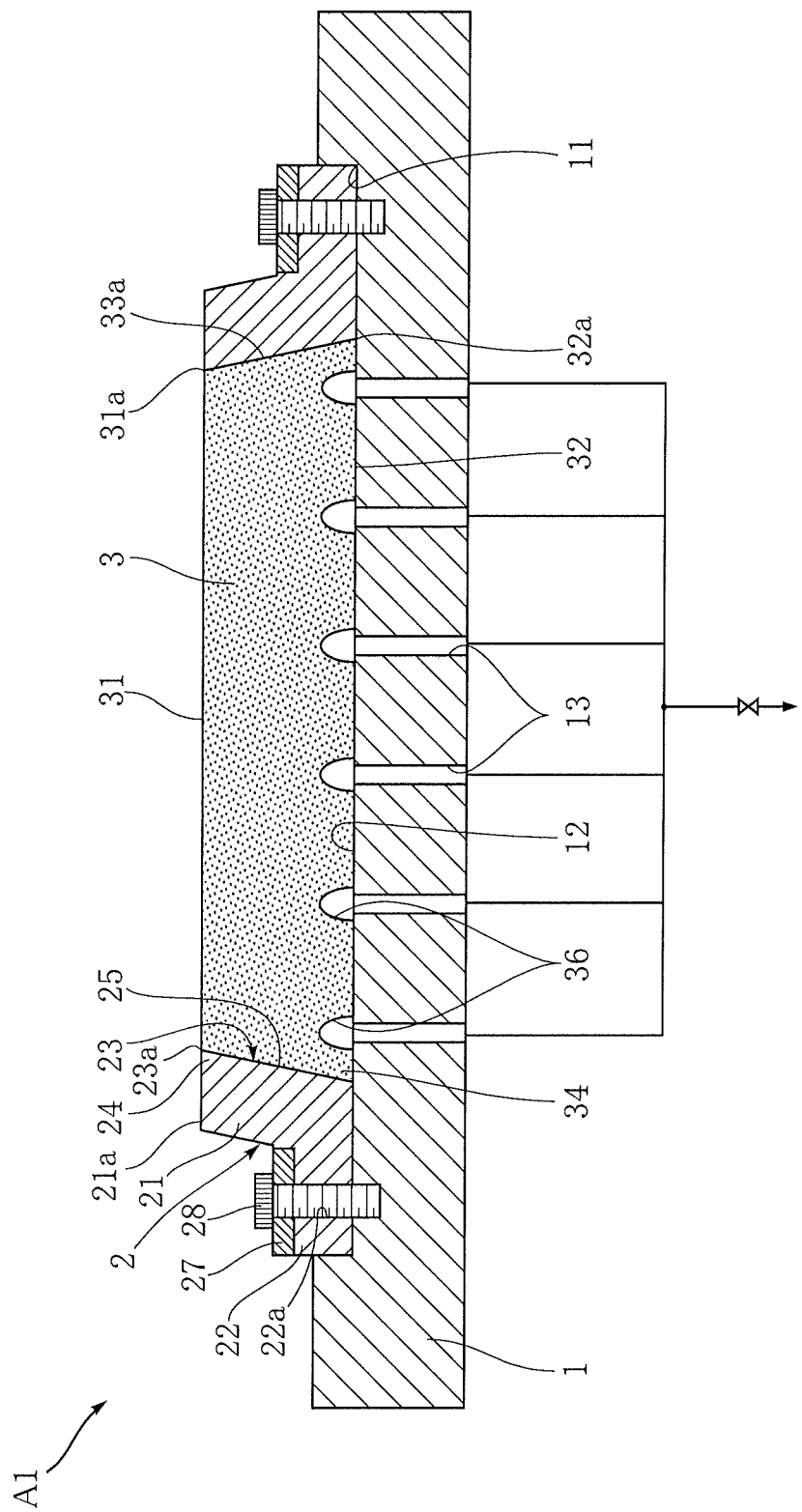
FIG. 3 is a cross-sectional view taken along the line in FIG. 2.
Figure 4:
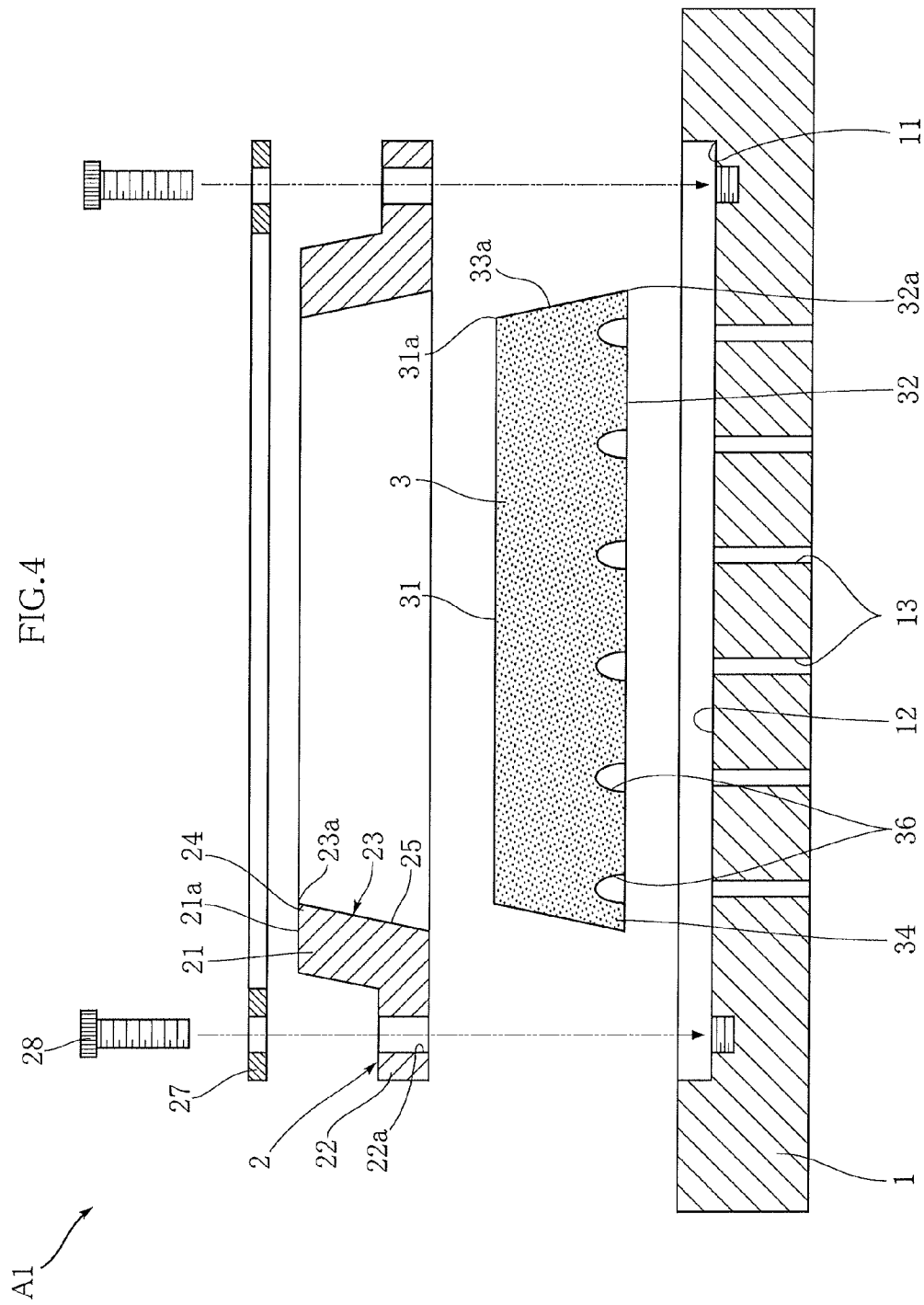
FIG. 4 is an exploded cross-sectional view of the suction-holding apparatus shown in FIG. 1.
Figure 5:
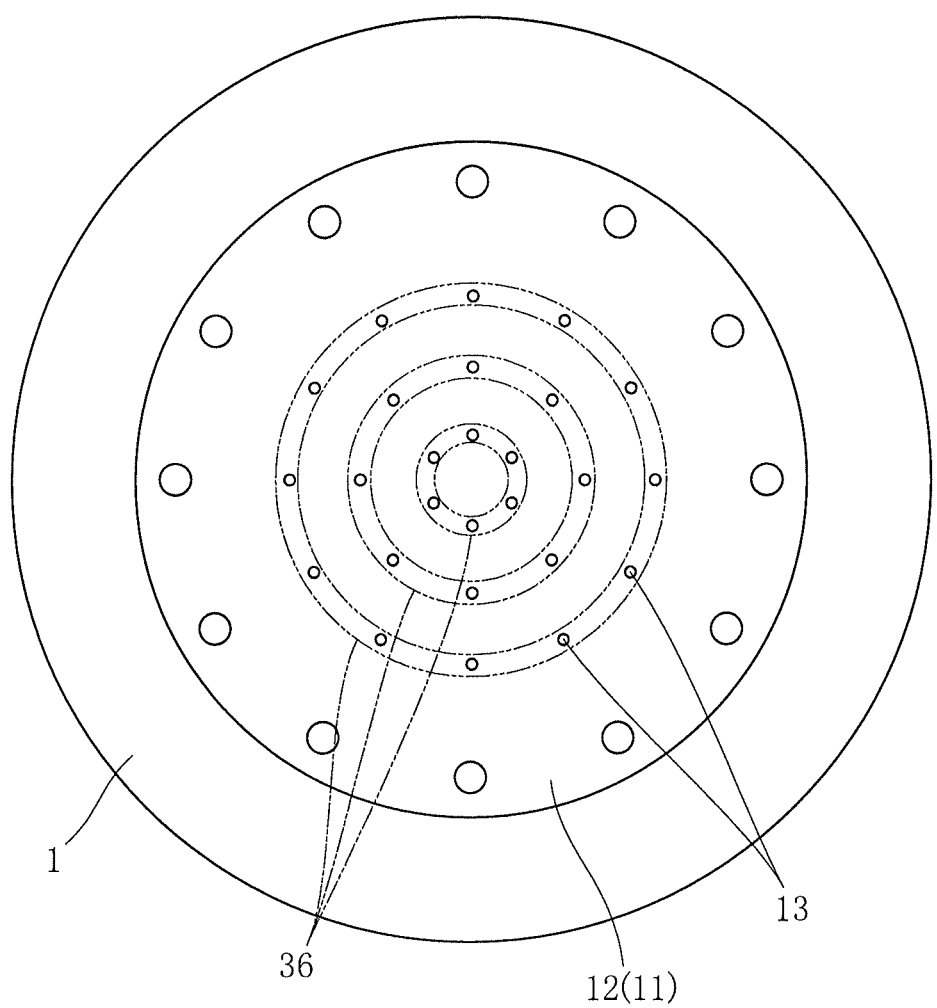
FIG. 5 is a plan view showing a base of the suction-holding apparatus shown in FIG. 1.

FIGS. 1 to 4 illustrate a suction-holding apparatus according to a first embodiment of the present invention. The suction-holding apparatus A1 according to this embodiment includes a base 1, a holding member 2, and a suction plate 3. The suction-holding apparatus A1 is intended for use, for example, in a wafer polishing apparatus B shown in FIG. 6 to hold a semiconductor wafer 5. FIG. 1 is a perspective view showing the suction-holding apparatus A1. FIG. 2 is a plan view of the suction-holding apparatus A1. FIG. 3 is a cross-sectional view of the suction-holding apparatus A1 taken along a line in FIG. 2, and FIG. 4 is an exploded cross-sectional view of the suction-holding apparatus A1. FIG. 5 is a plan view of the base 1.

The base 1 supports the holding member 2 and the suction plate 3. Preferably, the base 1 is made of a metal, and in the illustrated example, use is made of stainless steel. The base 1 has a circular shape as a whole in a plan view (see FIG. 2), and is formed with a cavity 11. The cavity 11 is circular and relatively shallow, and includes a bottom face 12. As shown in FIG. 5, the bottom face 12 is also circular.

The bottom face 12 is formed with a plurality of suction holes 13. The suction holes 13 each have an opening in the bottom face 12, and penetrate through the base 1. The suction holes 13 are connected to a non-illustrated suction device (suction source) such as a pump, through a hose or a pipe and a valve. When the suction device is activated, a suction force is exerted at the respective suction holes. Here, the suction holes 13 may also be utilized as outlets through which a fluid, typically exemplified by a gas such as air and a liquid such as water, is to be dispensed. In this embodiment, the suction holes 13 are arranged along a plurality of concentric circles. In addition, the bottom face 12 includes a threaded hole located close to the outer edge.

The holding member 2 serves to fix the suction plate 3 to the base 1, and is provided in the cavity 1 of the base 1, together with the suction plate 3. In this embodiment, the holding member 2 has a ring shape as a whole, and is made of, for example, a non-air-permeable ceramic. The holding member 2 includes an annular portion 21 and a flange portion 22.

The annular portion 21 is located relatively on the inner side, and includes a through-hole 23. The suction plate 3 is fitted in the through-hole 23. The through-hole 23 has an upper peripheral edge 23a. The upper peripheral edge 23a is the edge of the opening of the through-hole 23 on the opposite side of the base 1, and has a circular shape in this embodiment. In the through-hole 23, the opening corresponding to the upper peripheral edge 23a (upper opening in FIG. 3) is smaller in diameter than the opening on the side of the base 1 (lower opening in FIG. 3). In other words, the upper peripheral edge 23a is located on the radially inner side with respect to the opening edge of the through-hole 23 on the side of the base 1. Accordingly, the holding member 2 includes an eaved portion 24. In this embodiment, the eaved portion 24 is formed to extend along the entire circumference of the annular portion 21 of the holding member 2. In addition, the inner wall of the through-hole 23 constitutes a sloped surface 25 in this embodiment.

The flange portion 22 is formed in a ring shape so as to extend radially outward from the annular portion 21. In this embodiment, the bottom face of the flange portion 22 and the bottom face of the annular portion 21 are flush with each other and, as shown in FIG. 3, and the annular portion 21 is on the upper side with respect to the flange portion 22. The flange portion 22 includes a plurality of fixing holes 22a, each formed so as to penetrate through the flange portion 22 at positions corresponding to the respective threaded holes of the base 1 (see FIG. 5) in a plan view.

The holding member 2 is mounted on the base 1 with a plurality of bolts 28. The bolts 28 are each passed through the corresponding fixing hole 22a of the flange portion 22, and screw-fitted in the threaded hole formed on the bottom face 12 of the base 1. In this embodiment, a cover plate 27 is provided on the upper surface of the flange portion 22 of the holding member 2. The cover plate 27 is made of a metal such as stainless steel in a ring shape, and serves to prevent the flange portion 22 from being subjected to an excessive force of the bolt 28. In this embodiment, as shown in FIG. 3, the annular portion 21 of the holding member 2 upwardly protrudes to a higher level than the bolts 28. In other words, the upper end portion of the annular portion 21 is located on the side of a front face 31 of the suction plate 3 to be described later, with respect to the bolt 28, in the thickness direction of the suction plate 3.

The suction plate 3 serves to exert the suction force on an object to be held by suction, such as a semiconductor wafer, and is made of an air-permeable material. In this embodiment, the suction plate 3 is made of a porous ceramic for example in a disk shape as a whole, and includes a front face 31, a rear face 32, a sloped surface 33a, and a jutting-out portion 34.

The front face 31 and the rear face 32 are oriented opposite to each other in the thickness direction of the suction plate 3. The rear face 32 is opposed to the bottom face 12 of the base 1, and is in contact therewith or bonded to predetermined positions on the bottom face 12 with an adhesive.

The front face 31 has an outer edge 31a, and the rear face 32 has an outer edge 32a. The front face 31 and the rear face 32 have a circular shape and concentrically disposed, the front face 31 being smaller in diameter than the rear face 32. Thus, the outer edge 32a of the rear face 32 bulges radially outward with respect to the outer edge 31a of the front face 31. Accordingly, in this embodiment, the jutting-out portion 34 is formed along the entire circumference of the suction plate 3.

The sloped surface 33a is the region extending between the outer edge 31a of the front face 31 and the outer edge 32a of the rear face 32, and is a smooth surface inclined with respect to the thickness direction of the suction plate 3. As shown in FIG. 3, the sloped surface 33a is inclined in alignment with the sloped surface 25 of the through-hole 23 of the holding member 2.

From the viewpoint of the polishing process of the semiconductor wafer 5 to be described later, it is preferable that the front face 21a of the annular portion 21 of the holding member 2 and the front face 31 of the suction plate 3 are flush with each other as shown in FIG. 3.

To assemble the suction-holding apparatus A1, as shown in FIG. 4, the suction plate 3 is placed on the base 1 and the holding member 2 is mounted such that the suction plate 3 is fitted in the through-hole 23. Then the plurality of bolts 28 are fastened to the base 1 after placing the cover plate 27 on the flange portion 22 of the holding member 2, to thereby fix the holding member 2 onto the base 1. Upon fixing the holding member 2 onto the base 1, the suction plate 3 is also fixed to the base 1. Here, the rear face 32 of the suction plate 3 and the bottom face 12 of the base 1 may be bonded to each other with a non-illustrated adhesive.

Figure 6:
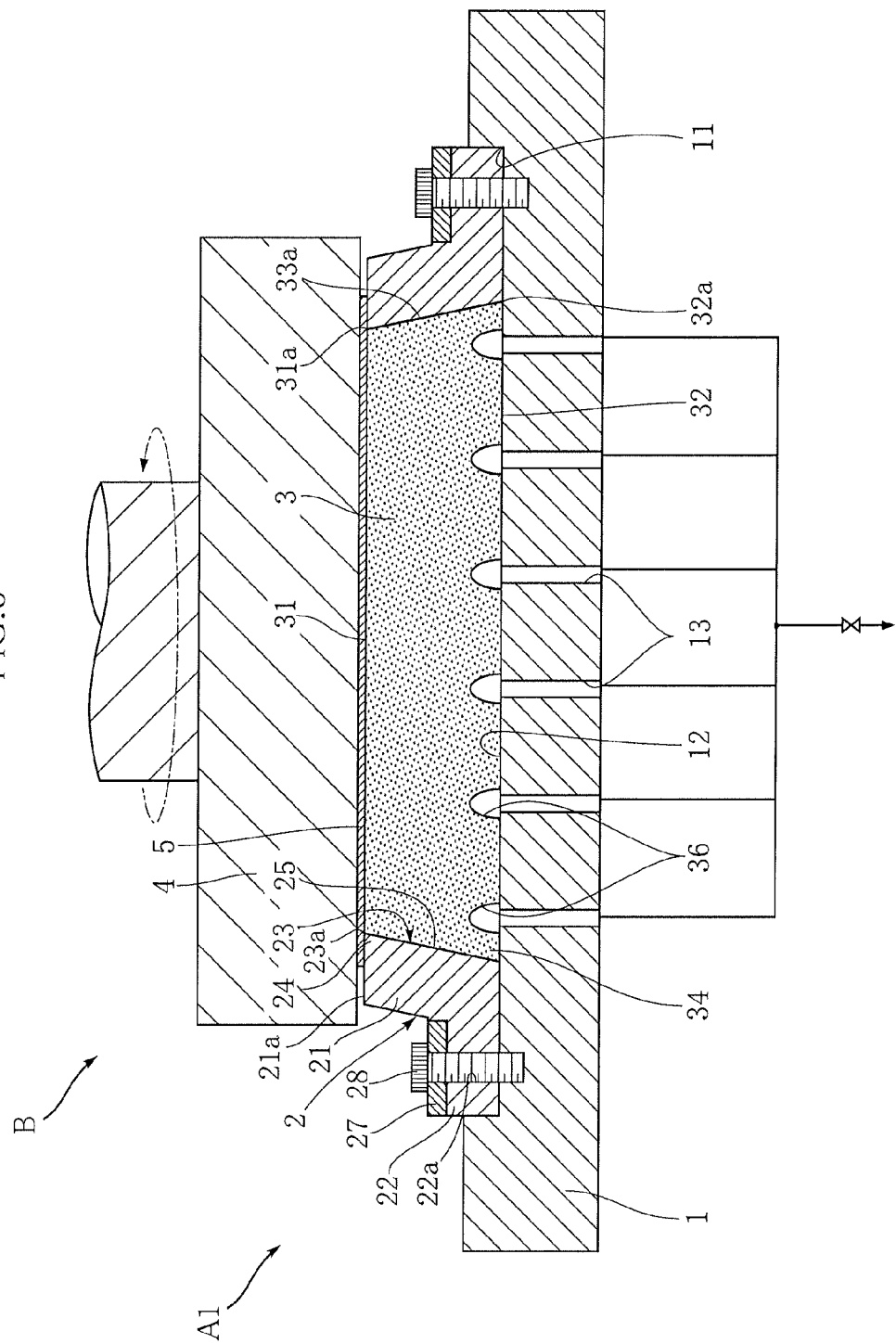
FIG. 6 is a fragmentary cross-sectional view of a wafer polishing apparatus that employs the suction-holding apparatus shown in FIG. 1.

FIG. 6 illustrates the wafer polishing apparatus B that employs the suction-holding apparatus A1. The wafer polishing apparatus B is made up of the suction-holding apparatus A1 and a polishing device 4. The polishing device 4 includes a whetstone, a polishing pad, or the like, located so as to oppose the suction-holding apparatus A1. The polishing device 4 may also include a supply device of a fluid used for the polishing process. The polishing device 4 is set to rotate while being pressed against the suction-holding apparatus A1. In addition, the polishing device 4 is set to be retracted to a separate position (not shown) from right above the suction-holding apparatus A1.

The wafer polishing apparatus B is used for polishing, for example, a semiconductor wafer 5. The semiconductor wafer 5 is made of Si for example, and has a disk shape having a diameter of approximately 4 inches to 8 inches. For example, the semiconductor wafer 5 having a thickness of 600 μm is finished in a thickness of 50 to 200 μm, through the polishing process performed by the wafer polishing apparatus B.

Upon driving the pump, air is sucked from predetermined positions on the suction plate 3 through the plurality of suction holes 13 of the base 1. The suction force thus generated holds the semiconductor wafer 5. When the semiconductor wafer 5 is placed on the suction-holding apparatus A1, it is preferable that the outer edge of the semiconductor wafer 5 overlaps the front face 21a of the annular portion 21 of the holding member 2, because the suction force from the suction plate 3 can be more effectively exerted on the semiconductor wafer 5. Then the polishing device 4 is driven to rotate while being pressed against the semiconductor wafer 5. The polishing of the semiconductor wafer 5 is thus performed.

Advantages provided by the suction-holding apparatus A1 and the wafer polishing apparatus B will be described hereunder.

Because of the jutting-out portion 34 formed on the suction plate 3 and the eaved portion 24 formed on the holding member 2, the suction plate 3 fitted in the through-hole 23 can be fixed to the base 1 with a pressure exerted toward the base 1, by the holding member 2. Accordingly, it is not mandatory to employ for example an adhesive to fix the suction plate 3 to the base 1. In addition, in the case of bonding the suction plate 3 to the base 1 with an adhesive, the suction plate 3 is prevented from unexpectedly floating from the base 1 even when the bonding force of the adhesive is degraded. Therefore, the suction plate 3 can be more securely fixed to the base 1. Further, the mentioned configuration allows the wafer polishing apparatus B to properly retain the semiconductor wafer 5 in a horizontal orientation. Properly retaining the semiconductor wafer 5 enables the polishing device 4 to perform the polishing operation with higher accuracy. Consequently, the semiconductor wafer 5 can be adjusted to a desired thickness and finished with excellent surface roughness.

Since the suction plate 3 is made of a porous ceramic, and the holding member 2 is made of a non-air-permeable ceramic, the suction plate 3 and the holding member 2 are expected to be polished by the polishing device 4 at generally the same rate. The configuration in which the front face 31 of the suction plate 3 and the front face 21a of the annular portion 21 of the holding member 2 are flush with each other is advantageous for more effectively exerting the suction force from the suction plate 3 on the semiconductor wafer 5 while retaining the semiconductor wafer 5 in the horizontal orientation. Allowing the suction plate 3 and the holding member 2 to be polished at generally the same rate enables the front face 31 of the suction plate 3 and the front face 21a of the annular portion 21 of the holding member 2 to remain flush with each other for a longer period of time.

Since the suction plate 3 includes the sloped surface 33a extending from the jutting-out portion 34 and the holding member 2 includes the sloped surface 25 constituting the inner wall of the through-hole 23, the jutting-out portion 34 of the suction plate 3 can be securely pressed by the eaved portion 24 of the holding member 2, and therefore the suction plate 3 can be securely fixed.

Since the jutting-out portion 34 of the suction plate 3 is formed along the entire circumference thereof and the eaved portion 24 of the holding member 2 is formed along the entire circumference thereof, the suction plate 3 can be uniformly pressed by the holding member 2. Such a configuration further assures the fixation of the suction plate 3.

Since the base 1 is made of a metal and the bolts 28 are employed to fix the holding member 2 onto the base 1, the holding member 2 can be firmly fixed to the base 1. Because of the presence of the cover plate 27, the holding member 2 can be exempted from local and excessive fastening force of the bolts 28, and hence the holding member 2 can be prevented from being damaged.

Since the annular portion 21 is located on the side of the front face 31 of the suction plate 3 with respect to the bolts 28 in the thickness direction of the suction plate 3, the polishing device 4 can perform the polishing operation free from interference with the bolts 28.

The suction plate 3 includes a plurality of recesses 36 formed on the rear face so as to overlap the respective suction holes 13 in a view in the thickness direction. The mentioned configuration allows the suction force to be exerted on a larger region of the suction plate 3 through the suction holes 13. Here, it is preferable to form the suction plate 3 in a certain level of thickness, in order to assure that the suction plate 3 is securely fixed via the sloped surface 33a. However, the increase in thickness of the suction plate 3 leads to an increase in suction resistance, which makes it difficult to perform uniform suction through the suction holes 13. Accordingly, the recesses 36 contribute to minimizing the mentioned drawback and achieving uniform sucking performance.

The plurality of suction holes 13 are arranged in a circle, and therefore the recesses 36 may be formed in a shape of a continuous annular groove. Such a configuration is advantageous for retaining the semiconductor wafer 5 of a circular shape with a uniform suction force.

FIGS. 7 to 11 illustrate other embodiments of the present invention. In these drawings, the constituents same as or similar to those of the first embodiment are given the same numeral.

Figure 7:
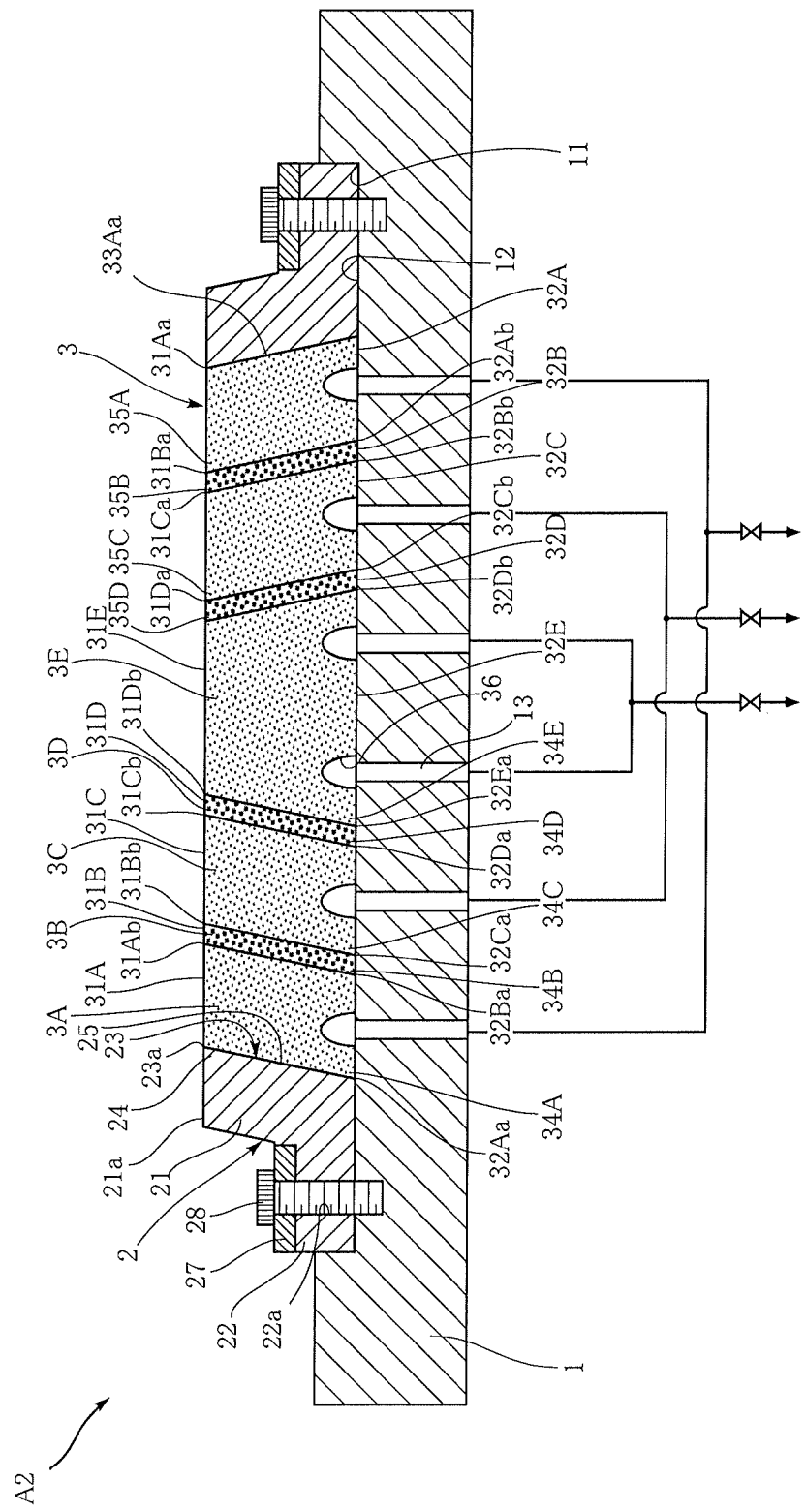
FIG. 7 is a cross-sectional view of a suction-holding apparatus according to a second embodiment of the present invention.
Figure 8:
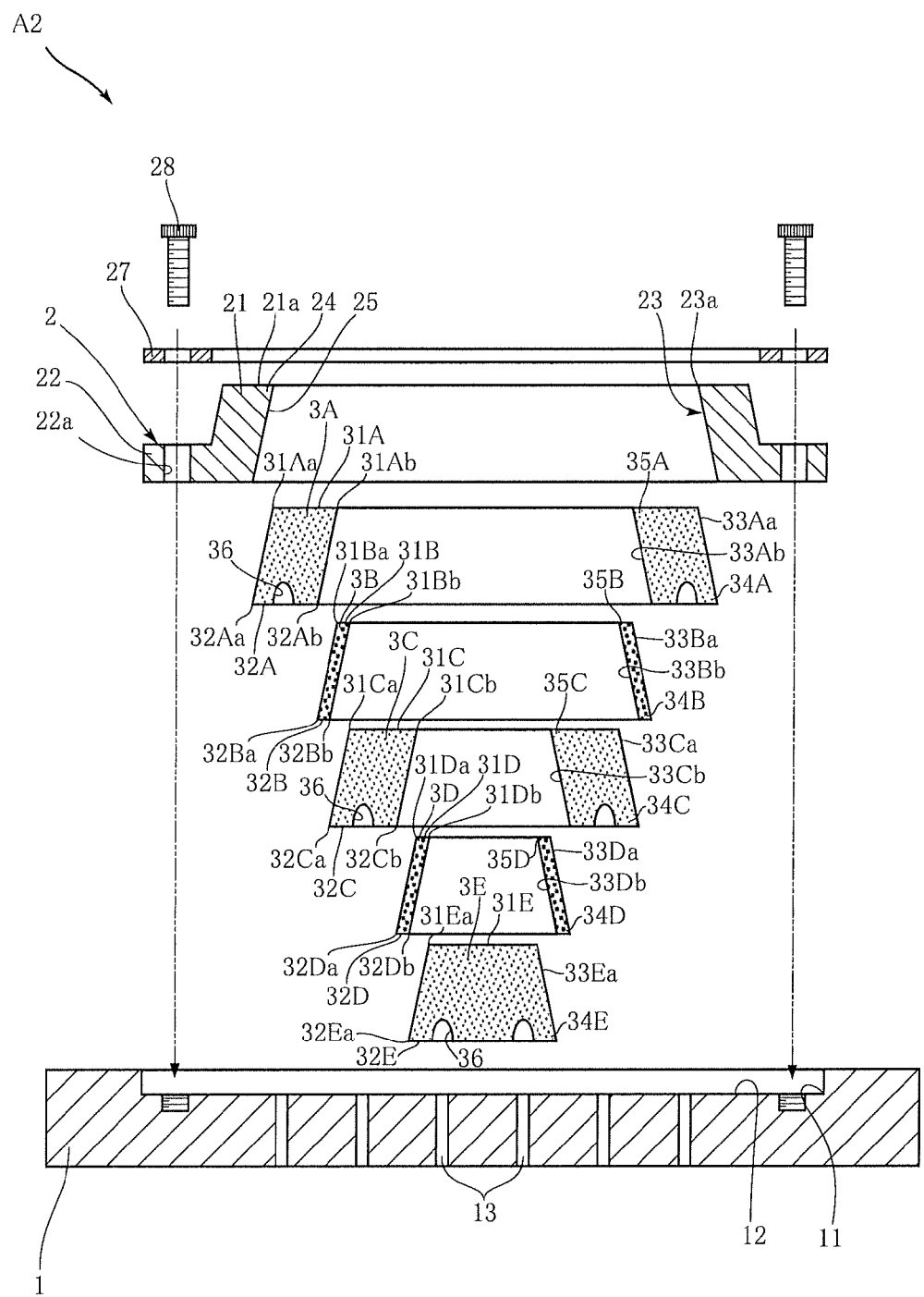
FIG. 8 is an exploded cross-sectional view of the suction-holding apparatus shown in FIG. 7.

FIGS. 7 and 8 illustrate a suction-holding apparatus according to a second embodiment of the present invention. The suction-holding apparatus A2 according to this embodiment is different from the first embodiment in the configuration of the suction plate 3. FIG. 7 is a cross-sectional view of the suction-holding apparatus A2, and FIG. 8 is an exploded cross-sectional view of the suction-holding apparatus A2.

In this embodiment, the suction plate 3 includes a plurality of annular elements 3A, 3B, 3C, 3D and a truncated cone element 3E. The annular elements 3A, 3B, 3C, 3D and the truncated cone element 3E are concentrically disposed, and the annular elements 3A, 3B, 3C, 3D are each formed in a ring shape in this embodiment. The annular elements 3A, 3C and the truncated cone element 3E are made of a material having relatively high permeability such as a porous ceramic having a relatively high aperture ratio, and the annular elements 3A, 3C correspond to the high-permeability annular elements in the present invention. The annular elements 3B, 3D are made of a material having relatively low permeability such as a porous ceramic having a relatively low aperture ratio, or a non-air-permeable ceramic, and the annular elements 3B, 3D correspond to the low-permeability annular elements in the present invention. The annular elements 3A, 3C and the truncated cone element 3E corresponding to the high-permeability annular elements and the annular elements 3B, 3D corresponding to the low-permeability annular elements are alternately arranged. Further, the annular elements 3A, 3B, 3C, 3D and the truncated cone element 3E are formed in the same size in the thickness direction (up-down direction in FIG. 7).

The annular element 3A includes a front face 31A, a rear face 32A, a sloped surface 33Aa, a sloped surface 33Ab, a jutting-out portion 34A, and an eaved portion 35A. The front face 31A and the rear face 32A are oriented opposite to each other in the thickness direction of the annular element 3A (suction plate 3). The rear face 32A is opposed to the bottom face 12 of the base 1 and, in this embodiment, either in contact with the bottom face 12 or bonded to a predetermined position on the bottom face 12 via a non-illustrated adhesive.

The front face 31A has an outer edge 31Aa and an inner edge 31Ab, and the rear face 32A has an outer edge 32Aa and an inner edge 32Ab. The front face 31A and the rear face 32A are disposed so as to form concentric rings in a plan view, the front face 31A being smaller in diameter than the rear face 32A. In other words, the outer edge 32Aa of the rear face 32A is located on the radially outer side with respect to the outer edge 31Aa of the front face 31A. Accordingly, the annular element 3A includes the jutting-out portion 34A along the entire circumference thereof. Further, the inner edge 31Ab of the front face 31A is located on the radially inner side with respect to the inner edge 32Ab of the rear face 32A. Accordingly, the annular element 3A includes the eaved portion 35A along the entire circumference thereof.

The sloped surface 33Aa is a smooth surface inclined with respect to the thickness direction of the suction plate 3, and extends between the outer edge 31Aa of the front face 31A and the outer edge 32Aa of the rear face 32A. The sloped surface 33Ab is a smooth surface inclined with respect to the thickness direction of the suction plate 3, and extends between the inner edge 31Ab of the front face 31A and the inner edge 32Ab of the rear face 32A. The sloped surface 33Aa and the sloped surface 33Ab are generally parallel to each other.

The annular element 3B includes a front face 31B, a rear face 32B, a sloped surface 33Ba, a sloped surface 33Bb, a jutting-out portion 34B, and an eaved portion 35B. The front face 31B and the rear face 32B are oriented opposite to each other in the thickness direction of the annular element 3B (suction plate 3). The rear face 32B is opposed to the bottom face 12 of the base 1 and, in this embodiment, either in contact with the bottom face 12 or bonded to a predetermined position on the bottom face 12 via a non-illustrated adhesive.

The front face 31B has an outer edge 31Ba and an inner edge 31Bb, and the rear face 32B has an outer edge 32Ba and an inner edge 32Bb. The front face 31B and the rear face 32B are disposed so as to form concentric rings in a plan view, the front face 31B being smaller in diameter than the rear face 32B. In other words, the outer edge 32Ba of the rear face 32B is located on the radially outer side with respect to the outer edge 31Ba of the front face 31B. Accordingly, the annular element 3B includes the jutting-out portion 34B along the entire circumference thereof. Further, the inner edge 31Bb of the front face 31B is located on the radially inner side with respect to the inner edge 32Bb of the rear face 32B. Accordingly, the annular element 3B includes the eaved portion 35B along the entire circumference thereof.

The sloped surface 33Ba is a smooth surface inclined with respect to the thickness direction of the suction plate 3, and extends between the outer edge 31Ba of the front face 31B and the outer edge 32Ba of the rear face 32B. The sloped surface 33Bb is a smooth surface inclined with respect to the thickness direction of the suction plate 3, and extends between the inner edge 31Bb of the front face 31B and the inner edge 32Bb of the rear face 32B. The sloped surface 33Ba and the sloped surface 33Bb are generally parallel to each other.

The annular element 3C includes a front face 31C, a rear face 32C, a sloped surface 33Ca, a sloped surface 33Cb, a jutting-out portion 34C, and an eaved portion 35C. The front face 31C and the rear face 32C are oriented opposite to each other in the thickness direction of the annular element 3C (suction plate 3). The rear face 32C is opposed to the bottom face 12 of the base 1 and, in this embodiment, either in contact with the bottom face 12 or bonded to a predetermined position on the bottom face 12 via a non-illustrated adhesive.

The front face 31C has an outer edge 31Ca and an inner edge 31Cb, and the rear face 32C has an outer edge 32Ca and an inner edge 32Cb. The front face 31C and the rear face 32C are disposed so as to form concentric rings in a plan view, the front face 31C being smaller in diameter than the rear face 32C. In other words, the outer edge 32Ca of the rear face 32C is located on the radially outer side with respect to the outer edge 31Ca of the front face 31C. Accordingly, the annular element 3C includes the jutting-out portion 34C along the entire circumference thereof. Further, the inner edge 31Cb of the front face 31C is located on the radially inner side with respect to the inner edge 32Cb of the rear face 32C. Accordingly, the annular element 3C includes the eaved portion 35C along the entire circumference thereof.

The sloped surface 33Ca is a smooth surface inclined with respect to the thickness direction of the suction plate 3, and extends between the outer edge 31Ca of the front face 31C and the outer edge 32Ca of the rear face 32C. The sloped surface 33Cb is a smooth surface inclined with respect to the thickness direction of the suction plate 3, and extends between the inner edge 31Cb of the front face 31C and the inner edge 32Cb of the rear face 32C. The sloped surface 33Ca and the sloped surface 33Cb are generally parallel to each other.

The annular element 3D includes a front face 31D, a rear face 32D, a sloped surface 33Da, a sloped surface 33Db, a jutting-out portion 34D, and an eaved portion 35D. The front face 31D and the rear face 32D are oriented opposite to each other in the thickness direction of the annular element 3D (suction plate 3). The rear face 32D is opposed to the bottom face 12 of the base 1 and, in this embodiment, either in contact with the bottom face 12 or bonded to a predetermined position on the bottom face 12 via a non-illustrated adhesive.

The front face 31D has an outer edge 31Da and an inner edge 31Db, and the rear face 32D has an outer edge 32Da and an inner edge 32Db. The front face 31D and the rear face 32D are disposed so as to form concentric rings in a plan view, the front face 31D being smaller in diameter than the rear face 32D. In other words, the outer edge 32Da of the rear face 32D is located on the radially outer side with respect to the outer edge 31Da of the front face 31D. Accordingly, the annular element 3D includes the jutting-out portion 34D along the entire circumference thereof. Further, the inner edge 31Db of the front face 31D is located on the radially inner side with respect to the inner edge 32Db of the rear face 32D. Accordingly, the annular element 3D includes the eaved portion 35D along the entire circumference thereof.

The sloped surface 33Da is a smooth surface inclined with respect to the thickness direction of the suction plate 3, and extends between the outer edge 31Da of the front face 31D and the outer edge 32Da of the rear face 32D. The sloped surface 33Db is a smooth surface inclined with respect to the thickness direction of the suction plate 3, and extends between the inner edge 31Db of the front face 31D and the inner edge 32Db of the rear face 32D. The sloped surface 33Da and the sloped surface 33Db are generally parallel to each other.

The truncated cone element 3E includes a front face 31E, a rear face 32E, a sloped surface 33Ea, and a jutting-out portion 34E. The front face 31E and the rear face 32E are oriented opposite to each other in the thickness direction of the truncated cone element 3E (suction plate 3). The rear face 32E is opposed to the bottom face 12 of the base 1 and, in this embodiment, either in contact with the bottom face 12 or bonded to a predetermined position on the bottom face 12 via a non-illustrated adhesive.

The front face 31E has an outer edge 31Ea and the rear face 32E has an outer edge 32Ea. The front face 31E and the rear face 32E are disposed so as to form concentric circles in a plan view, the front face 31E being smaller than the rear face 32E. In other words, the outer edge 32Ea of the rear face 32E is located on the radially outer side with respect to the outer edge 31Ea of the front face 31E. Accordingly, the truncated cone element 3E includes the jutting-out portion 34E along the entire circumference thereof.

The sloped surface 33Ea is a smooth surface inclined with respect to the thickness direction of the suction plate 3, and extends between the outer edge 31Ea of the front face 31E and the outer edge 32Ea of the rear face 32E.

In this embodiment, the annular elements 3B, 3D corresponding to the low-permeability annular elements are significantly smaller in radial width than the annular elements 3A, 3C corresponding to the high-permeability annular elements. In addition, the radius of the truncated cone element 3E is significantly larger than the radial width of the annular elements 3B, 3D. With such a configuration, the annular elements 3B, 3D serve as blocking walls that blocks airflow. In contrast, the annular elements 3A, 3C and the truncated cone element 3E, intended for positive air permeation, each include a plurality of recesses 36. The recesses 36 are each formed in a shape of an annular groove as in the first embodiment, in a shape, size, and location corresponding to the suction holes 13 of the base 1 in a view in the thickness direction of the suction plate 3.

In the assembly of the suction-holding apparatus A2, the truncated cone element 3E, the annular element 3D, the annular element 3C, the annular element 3B, and the annular element 3A are concentrically placed in this order on the base 1, as shown in FIG. 8. The sloped surface 33Ea of the truncated cone element 3E and the sloped surface 33Db of the annular element 3D are parallel to each other and generally the same in diameter. Accordingly, the sloped surface 33Ea of the truncated cone element 3E and the sloped surface 33Db of the annular element 3D are brought into contact with each other. Likewise, the sloped surface 33Da of the annular element 3D and the sloped surface 33Cb of the annular element 3C are parallel to each other and generally the same in diameter. Accordingly, the sloped surface 33Da of the annular element 3D and the sloped surface 33Cb of the annular element 3C are brought into contact with each other. Further, the sloped surface 33Ca of the annular element 3C and the sloped surface 33Bb of the annular element 3B are parallel to each other and generally the same in diameter. Accordingly, the sloped surface 33Ca of the annular element 3C and the sloped surface 33Bb of the annular element 3B are brought into contact with each other. Still further, the sloped surface 33Ba of the annular element 3B and the sloped surface 33Ab of the annular element 3A are parallel to each other and generally the same in diameter. Accordingly, the sloped surface 33Ba of the annular element 3B and the sloped surface 33Ab of the annular element 3A are brought into contact with each other.

Then the holding member 2 is mounted, with the suction plate 3 composed of the annular elements 3A, 3B, 3C, 3D and the truncated cone element 3E fitted in the through-hole 23. The sloped surface 33Aa of the annular element 3A and the sloped surface 25 of the holding member 2 are parallel to each other and generally the same in diameter. Accordingly, the sloped surface 33Aa of the annular element 3A and the sloped surface 25 of the holding member 2 are brought into contact with each other.

After placing the cover plate 27 on the flange portion 22 of the holding member 2, the plurality of bolts 28 are fastened to the base 1, to thereby fix the holding member 2 onto the base 1. Upon fixing the holding member 2 onto the base 1, the fastening force of the bolts 28 is transmitted to the annular element 3A, the annular element 3B, the annular element 3C, the annular element 3D, and the truncated cone element 3E through the holding member 2. The suction plate 3 is thus fixed to the base 1. Here, the rear face 32 of the suction plate 3 and the bottom face 12 of the base 1 may be bonded to each other with a non-illustrated adhesive.

In this embodiment, the suction holes 13 of the base 1 are divided into three groups, each of which is connected to a pump serving as the suction source. The three groups are respectively composed of the suction holes 13 overlapping the recess 36 of the annular element 3A, the suction holes 13 overlapping the recess 36 of the annular element 3C, and the suction holes 13 overlapping the recess 36 of the truncated cone element 3E. The suction holes 13 in each of the groups can be selectively caused to exert the suction force, by controlling the action of the corresponding valves shown in FIG. 7.

The configuration according to this embodiment allows different operation modes to be selectively performed by controlling the action of the valves, for example a mode of causing only the truncated cone element 3E to exert the suction force, a mode of causing only the truncated cone element 3E and the annular element 3C to exert the suction force, and a mode of causing both of the annular elements 3A, 3C and the truncated cone element 3E. Therefore, the suction area can be selected according to the diameter of the semiconductor wafer 5, which may differ in a range of 4 inches to 8 inches. Thus, the semiconductor wafers 5 of a plurality of different sizes can be properly retained.

The annular elements 3B, 3D serve as blocking walls, because of the low permeability. Such a configuration prevents the suction force from being exerted in a region where the suction force should not be generated while performing one of the selective operation modes, and prevents the suction force from declining in the region where the suction force is supposed to be exerted. In order to assure the effectiveness of the suction, it is preferable that the peripheral edge of the semiconductor wafer 5 to be held by suction overlaps the annular elements 3B, 3D which are low-permeability annular elements, or the holding member 2.

The plurality of annular elements 3A, 3B, 3C, 3D and the truncated cone element 3E transmit the binding force of the holding member 2 among one another. Therefore, the plurality of independently formed elements, namely the annular elements 3A, 3B, 3C, 3D and the truncated cone element 3E, can be collectively fixed to the base 1 by simply mounting the holding member 2, a single piece of component, on the base 1.

Figure 9:
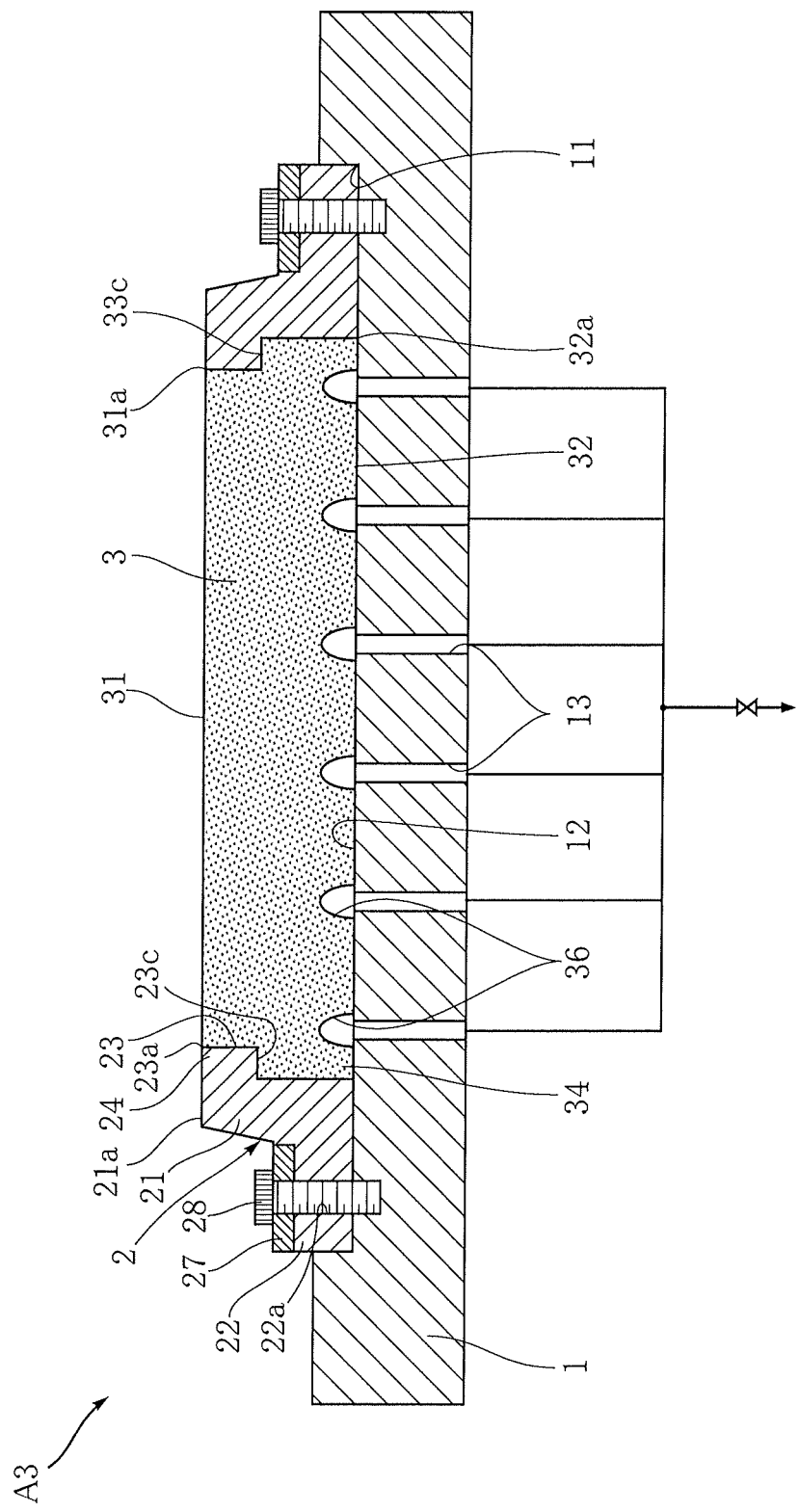
FIG. 9 is a cross-sectional view of a suction-holding apparatus according to a third embodiment of the present invention.

FIG. 9 illustrates a suction-holding apparatus according to a third embodiment of the present invention. The suction-holding apparatus A3 according to this embodiment has generally the same configuration as that of the suction-holding apparatus A1, except for a slight difference in the holding member 2 and the suction plate 3.

In this embodiment, the through-hole 23 of the holding member 2 includes a stepped portion 23c. The stepped portion 23c is a region connecting between a surface extending from the upper peripheral edge 23a of the through-hole 23 in the thickness direction of the suction plate 3, and a surface extending from the peripheral edge of the through-hole 23 opposite to the upper peripheral edge 23a in the thickness direction of the suction plate 3. In this embodiment, the stepped portion 23c is formed along the entire circumference of the inner wall of the through-hole 23. The holding member 2 configured as above also includes the eaved portion 24.

The suction plate 3 also includes a stepped portion 33c. The stepped portion 33c is a region connecting between a surface extending from the outer edge 31a of the front face 31 in the thickness direction of the suction plate 3, and a surface extending from the outer edge 32a of the rear face 32 in the thickness direction of the suction plate 3. In this embodiment, the stepped portion 33c is formed along the entire circumference of the suction plate 3. The suction plate 3 configured as above also includes the jutting-out portion 34.

When the holding member 2 and the suction plate 3 are mounted on the base 1, the stepped portion 23c of the holding member 2 and the stepped portion 33c of the suction plate 3 are engaged with each other, and more preferably abutted to each other.

The configuration according to this embodiment also allows the suction plate 3 to be effectively fixed to the base 1. Further, as is apparent from this embodiment, the stepped portions configured as above may be applied to the holding member 2 of the suction-holding apparatus A2 and one or more selected ones or all of the annular elements 3A, 3B, 3C, 3D, and the truncated cone element 3E in combination.

Figure 10:
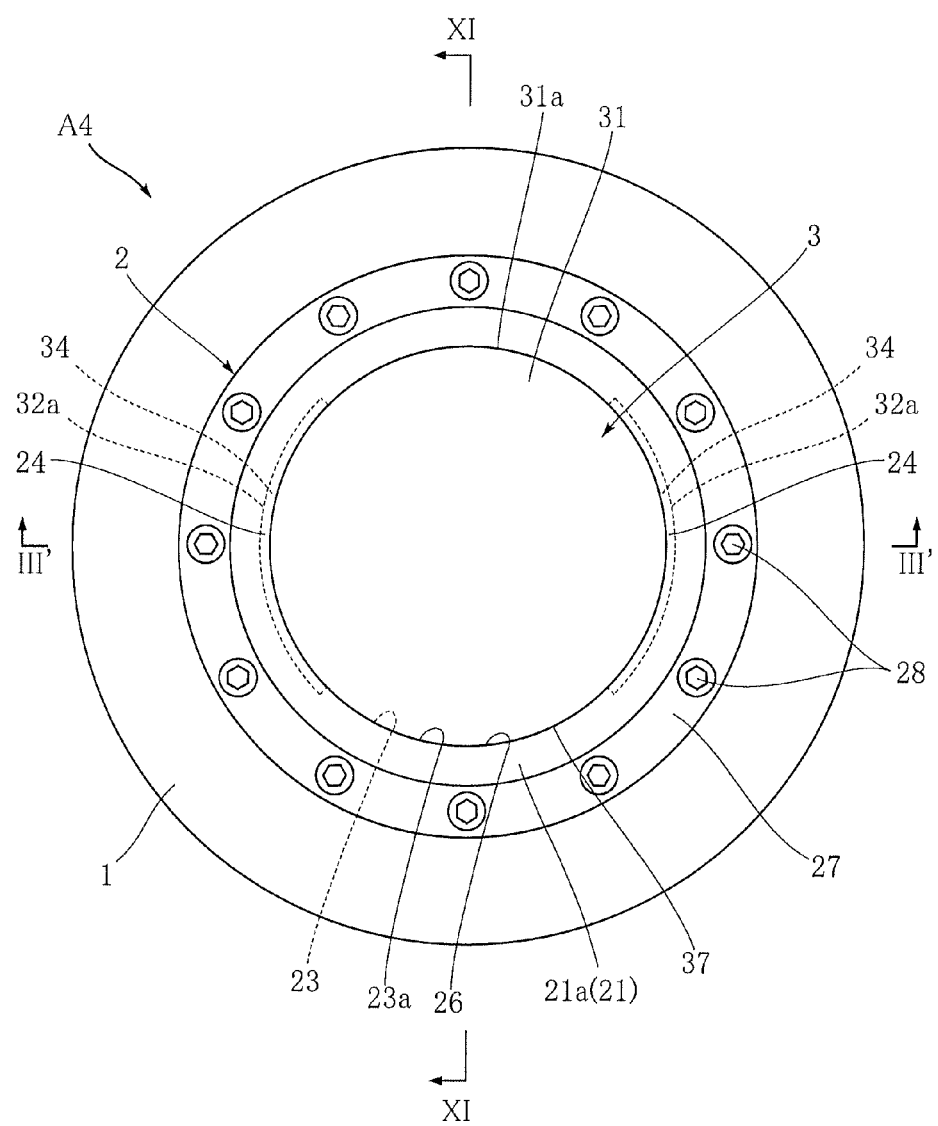
FIG. 10 is a plan view showing a suction-holding apparatus according to a fourth embodiment of the present invention.

FIGS. 10 and 11 illustrate a suction-holding apparatus according to a fourth embodiment of the present invention. FIG. 10 is a plan view showing the suction-holding apparatus A4 according to this embodiment, and FIG. 11 is a cross-sectional view taken along a line XI-XI in FIG. 10. Here, the configuration of the suction-holding apparatus A4 expressed as a cross-sectional view taken along a line III'-III' in FIG. 10 is generally based on the configuration of the suction-holding apparatus A1 shown in FIG. 3.

In this embodiment, as shown in FIG. 10, the holding member 2 includes a pair of eaved portions 24 and the suction plate 3 includes a pair of jutting-out portions 34. The eaved portions 24 are spaced from each other in the circumferential direction. The jutting-out portions 34 are also spaced from each other in the circumferential direction. The positions and the lengths of the pair of eaved portions 24 and the pair of jutting-out portions 34 in the circumferential direction are generally the same. The eaved portions 24 and the jutting-out portions 34 are each formed over a range of approximately 90 degrees in the circumferential direction. Accordingly, the interval between the pair of eaved portions, and the interval between the pair of jutting-out portions 34 are also approximately 90 degrees in the circumferential direction.

The sloped surface 25 or the stepped portion 23c is formed in the region corresponding to the eaved portion 24 of the holding member 2. Likewise, for engagement with the above, the sloped surface 33a or the stepped portion 33c is formed in the region corresponding to the jutting-out portion 34 of the suction plate 3.

As shown in FIG. 11, the through-hole 23 of the holding member 2 includes a pair of upright side faces 26 formed between the pair of eaved portions 24. The upright side faces 26 are erected in the thickness direction of the suction plate 3, and define a partial cylindrical shape. Likewise, the suction plate 3 includes a pair of upright side faces 37 formed between the pair of jutting-out portions 34. The upright side faces 37 are erected in the thickness direction of the suction plate 3, and have a partial cylindrical shape. The upright side faces 26 of the holding member 2 and the respectively corresponding upright side faces 37 of the suction plate 3 are parallel to each other and generally the same in diameter.

The configuration according to this embodiment also allows the suction plate 3 to be effectively fixed to the base 1. Further, the holding member 2 and the suction plate 3 are not uniformly configured in the circumferential direction, but each include discontinuous regions in the circumferential direction. The discontinuous regions serve to prevent the suction plate 3 from unexpectedly rotating with respect to the base 1.

The suction-holding apparatus and the wafer polishing apparatus according to the present invention are in no way limited to the foregoing embodiments. Specific configurations of each of the constituents of the suction-holding apparatus and the wafer polishing apparatus according to the present invention may be modified in various manners.

The shapes of the base, the holding member, and the suction plate in the present invention are not limited to circular or annular shapes, but may be generally polygonal or annular polygonal shape. Although the suction-holding apparatus according to the present invention is appropriate for use with a wafer polishing apparatus to hold a semiconductor wafer, the suction-holding apparatus according to the present invention may be broadly employed for the purpose of holding an object by using a suction force.

The invention claimed is:

1. A suction-holding apparatus comprising:
a suction plate made of an air-permeable material and including a front face and a rear face that are spaced apart from each other in a thickness direction of the suction plate;
a holding member formed with a through-hole in which the suction plate is placed; and
a base to which the holding member is attached, the base being adjacent to the rear face of the suction plate;
wherein the suction plate is formed with at least one jutting-out portion in a manner such that an outer edge of the rear face is disposed outwardly from an outer edge of the front face as viewed in the thickness direction at the jutting-out portion,
the through-hole includes a first edge and a second edge that are spaced apart from each other in the thickness direction, the first edge being adjacent to the base,
the holding member is formed with at least one eaved portion in a manner such that the second edge of the through-hole is disposed inwardly from the outer edge of the rear face as viewed in the thickness direction at the jutting-out portion,
the suction plate comprises a plurality of annular elements that are concentrically disposed, each annular element having an outer side surface that tapers in the thickness direction,
the holding member has an inner surface tapering in the thickness direction, and the plurality of annular elements include an outermost annular element with which an entirety of the inner surface of the holding member is in direct contact, and
the outermost annular element has a rear face held in direct contact with the base.

2. The suction-holding apparatus according to claim 1, wherein at least a part of the suction plate is made of a porous ceramic.

3. The suction-holding apparatus according to claim 2, wherein the holding member is made of a non-air-permeable ceramic.

4. The suction-holding apparatus according to claim 1, wherein the holding member includes a surface flush with the front face of the suction plate.

5. The suction-holding apparatus according to claim 1, wherein the jutting-out portion of the suction plate includes a sloped surface extending between the outer edge of the front face and the outer edge of the rear face.

6. The suction-holding apparatus according to claim 1, wherein the jutting-out portion of the suction plate includes a stepped portion disposed between the outer edge of the front face and the outer edge of the rear face.

7. The suction-holding apparatus according to claim 1, wherein the jutting-out portion of the suction plate is formed along an entire circumference of the suction plate, and the eaved portion of the holding member is formed along an entire circumference of the holding member.

8. The suction-holding apparatus according to claim 1, wherein the suction plate includes an additional jutting-out portion spaced apart from said at least one jutting-out portion, and
the holding member includes an additional eaved portion spaced apart from said at least one eaved portion.

9. The suction-holding apparatus according to claim 8, wherein the suction plate includes an upright side face that is located between said at least one jutting-out portion and the additional jutting-out portion and erected in the thickness direction, and
the holding member includes an upright side face that is located between said at least one eaved portion and the additional eaved portion and erected in the thickness direction.

10. The suction-holding apparatus according to claim 1, wherein each of the annular elements includes a front face and a rear face that are spaced apart from each other in the thickness direction, and
each annular element is formed with a jutting-out portion and an eaved portion, an outer edge of the rear face of said each annular element is disposed outwardly from an outer edge of the front face of said each annular element as viewed in the thickness direction at the jutting-out portion of said each annular element, and an inner edge of the front face of said each annular element is disposed inwardly from an inner edge of the rear face of said each annular element as viewed in the thickness direction at the eaved portion of said each annular element.

11. The suction-holding apparatus according to claim 10, wherein the annular elements include high-permeability annular elements and low-permeability annular elements having a lower air permeability than the high-permeability annular elements, and the high-permeability annular elements and the low-permeability annular elements are alternately located.

12. The suction-holding apparatus according to claim 1, wherein the base is made of a metal.

13. The suction-holding apparatus according to claim 12, further comprising a bolt for fixing the holding member to the base.

14. The suction-holding apparatus according to claim 13, wherein the holding member includes an annular portion in which the through-hole is formed, and a flange portion outwardly extending from the annular portion.

15. The suction-holding apparatus according to claim 14, wherein the flange portion is formed with a fixing hole through which the bolt is passed.

16. The suction-holding apparatus according to claim 15, wherein the annular portion includes a portion offset from the bolt toward the front face of the suction plate in the thickness direction.

17. The suction-holding apparatus according to claim 1, wherein the base includes a bottom face opposed to the rear face of the suction plate, and the bottom face is formed with at least one suction hole.

18. The suction-holding apparatus according to claim 17, wherein the suction plate include a recess formed in the rear face and located so as to overlap said at least one suction hole as viewed in the thickness direction.

19. The suction-holding apparatus according to claim 1, wherein the base includes a bottom face opposed to the rear face of the suction plate, and the bottom face is formed with a plurality of the suction holes arranged in a circle, and the suction plate includes an annular groove formed in the rear face and located so as to overlap the suction holes as viewed in the thickness direction.

20. A wafer polishing apparatus comprising:
a suction-holding apparatus according to claim 1; and
a polishing device for polishing a semiconductor wafer held by the suction-holding apparatus.

* * * * *